(12) United States Patent
Higashi et al.

(10) Patent No.: US 10,718,051 B2
(45) Date of Patent: Jul. 21, 2020

(54) METHODS FOR CHEMICAL VAPOR DEPOSITION (CVD) IN A MOVABLE LINER ASSEMBLY

(71) Applicant: Alta Devices, Inc., Sunnyvale, CA (US)

(72) Inventors: Gregg Higashi, San Jose, CA (US); Khurshed Sorabji, San Jose, CA (US); Lori D. Washington, Union City, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 15/971,571

(22) Filed: May 4, 2018

(65) Prior Publication Data
US 2018/0251897 A1    Sep. 6, 2018

Related U.S. Application Data

(62) Division of application No. 13/222,881, filed on Aug. 31, 2011, now Pat. No. 9,982,346.

(51) Int. Cl.
| | | |
|---|---|---|
| *C23C 16/458* | (2006.01) | |
| *C23C 16/455* | (2006.01) | |
| *C23C 16/48* | (2006.01) | |

(52) U.S. Cl.
CPC .... *C23C 16/45565* (2013.01); *C23C 16/4585* (2013.01); *C23C 16/4586* (2013.01); *C23C 16/45591* (2013.01); *C23C 16/481* (2013.01)

(58) Field of Classification Search
CPC ............ C23C 16/4401; C23C 16/4402; C23C 16/4404; C23C 16/48; C23C 16/458;
(Continued)

(56) References Cited

U.S. PATENT DOCUMENTS

| | | | |
|---|---|---|---|
| 4,927,993 A | * | 5/1990 | Simmons ............ E05B 17/0016 219/201 |
| 5,192,370 A | | 3/1993 | Oda et al. |
| | | | (Continued) |

OTHER PUBLICATIONS

Shimizu, Hideharu, et al., "Self-Assembled Nano-Stuffing Structure in CVD and ALD Co(W) Films as a Single-Layered Barrier/Liner for Future Cu-Interconnects". ECS Journal of Solid State Science and Technology, 2(11) p. 471-p. 477 (2013).*

(Continued)

*Primary Examiner* — Bret P Chen
(74) *Attorney, Agent, or Firm* — Arent Fox, LLP

(57) ABSTRACT

An example method for chemical vapor deposition (CVD) of thin films includes providing a deposition zone in a reaction chamber having a fixed showerhead assembly that introduces CVD reactive gases under positive pressure into the deposition zone. The example method also includes moving a substrate carrier beneath the showerhead assembly in the reaction chamber, the substrate carrier supports and transports at least one substrate within the reaction chamber so as to be subjected to a CVD process by the CVD reactive gases. The example method also includes providing a liner assembly shrouding the deposition zone and including at least one partial enclosure around the deposition zone isolating the deposition zone and the substrate carrier, whereby solid reaction byproducts are plated onto material in the liner assembly and gaseous reaction byproducts flow radially outward, the liner assembly being mounted on the substrate carrier for motion with the substrate carrier.

14 Claims, 4 Drawing Sheets

(58) Field of Classification Search
CPC ..... C23C 16/46; C23C 16/455; H01L 21/677; H01L 21/67703; H01L 21/67706
See application file for complete search history.

(56) References Cited

U.S. PATENT DOCUMENTS

| | | | |
|---|---|---|---|
| 5,647,912 A | 7/1997 | Kaminishizono et al. | |
| 6,085,689 A * | 7/2000 | Sandhu | C23C 16/4412 118/715 |
| 6,277,237 B1 | 8/2001 | Schoepp et al. | |
| 6,336,423 B1 | 1/2002 | Okamura et al. | |
| 6,471,459 B2 * | 10/2002 | Blonigan | H01L 21/67709 104/282 |
| 6,613,587 B1 | 9/2003 | Carpenter et al. | |
| 8,431,493 B2 | 4/2013 | Lindenberg | |
| 2004/0134427 A1 | 7/2004 | Derderian et al. | |
| 2005/0045105 A1 * | 3/2005 | Choi | C23C 16/455 118/728 |
| 2006/0073276 A1 * | 4/2006 | Antonissen | C23C 16/4412 427/248.1 |
| 2009/0165710 A1 * | 7/2009 | Kee | C23C 14/042 118/503 |
| 2010/0166955 A1 * | 7/2010 | Becker | C23C 16/4401 427/248.1 |
| 2012/0240853 A1 * | 9/2012 | Carlson | C23C 16/4404 118/715 |
| 2013/0086915 A1 * | 4/2013 | Cihlar | F23R 3/002 60/755 |
| 2014/0224174 A1 * | 8/2014 | Abedijaberi | C23C 16/45563 118/715 |
| 2016/0160351 A1 * | 6/2016 | Seo | C23C 16/505 118/723 R |
| 2019/0136375 A1 * | 5/2019 | Abedijaberi | C23C 16/45563 |
| 2019/0136376 A1 * | 5/2019 | Abedijaberi | C23C 16/45563 |

OTHER PUBLICATIONS

Bedajangam, S.K., et al., "Friction Losses between Piston Ring-Liner Assembly of Internal Combustion Engine: A Review". International Journal of Scientific and Research Publications, vol. 3, Issue 6, Jun. 2013, pp. 1-3.*

Sutaria, B.M., et al., "Simulation and Modeling of Friction Force and Oil Film Thickness in Piston Ring—Cylinder Liner Assembly of an I.C. Engine". Proceedings of the World Congress on Engineering 2009 vol. II WCE 2009, Jul. 1-2, 2009, London, U.K., pp. 1-6.*

* cited by examiner

METHODS FOR CHEMICAL VAPOR DEPOSITION (CVD) IN A MOVABLE LINER ASSEMBLY

CROSS-REFERENCE TO RELATED APPLICATION

This application is a Divisional of U.S. patent application Ser. No. 13/222,881, entitled "Movable Liner Assembly for a Deposition Zone in a CVD Reactor," filed on Aug. 31, 2011 (now U.S. Pat. No. 9,982,346 issued May 29, 2018), which is incorporated herein its entirety by this reference.

TECHNICAL FIELD

The present invention relates to chemical vapor deposition thin-film deposition reactors, and relates particularly to protective liners that may be provided in such deposition reactors.

BACKGROUND ART

Chemical vapor deposition (CVD) processes use induced chemical reactions of gaseous precursor molecules to deposit one or more thin-film layers onto the surface of a substrate. For example, a trimethylgallium and arsine reaction induced by a combination of elevated temperature and radio frequency energy can be used to produce a gallium arsenide film layer. A wide variety of CVD precursor substances are known.

Frequently encountered challenges involving CVD reactors include uniformity of deposition, contamination issues, and downtime for reactor maintenance affecting throughput. Uniformity of deposition requires a corresponding uniformity of reactor environment conditions in the vicinity of substrate surface being processed, including uniform reaction gas mixture and concentration and uniform temperature. Ideally, deposition will occur only on the surface of the substrate being processed, with such deposition being substantially uniform over that substrate. In practice, unwanted deposition (as well as precursor condensation) may occur also on some surfaces of the reactor itself that are exposed to the precursor molecules or intermediate reaction products under conditions that allow deposition. When surface deposits build up in the reactor, material can break off to introduce contaminant particles to the reactor environment. The surface build-up can also adversely affect processing conditions that may lead to decreased deposition rates onto the substrate or deposition non-uniformity. To handle these issues, the reactor must be periodically cleaned to remove any unwanted depositions from the reactor surfaces, which leads in turn to reactor downtime and reduced throughput.

SUMMARY

A chemical vapor deposition (CVD) reactor in accord with the present invention comprises a gas and heat isolated deposition zone protected by a movable liner assembly that partially shrouds the deposition zone within conventional reactor housing, over a workpiece, thereby forming a virtual reactor within a conventional reactor. The liner is movable because it is associated with a moving carrier but a stationary showerhead, so that the liner can be cleaned and replaced away from the deposition zone. The deposition zone is constructed so as to provide a positive pressure reactive gas first environment supporting thin film deposition thermally isolated from a surrounding lower pressure and energy providing second environment. A movable substrate carrier is constructed to support a substrate within the deposition zone so as to be subjected to a CVD process in the deposition zone. The liner assembly is made of a liner material with liner walls that are positioned so as to form inner and outer partial enclosures or shrouds that help to ensure uniformity of deposition such that the inner partial enclosure is protected within the outer partial enclosure. The liner assembly forms a hot zone surrounding a substrate to be processed so as to retain heat in that zone and also maintains a concentration of process gas in proximity to the substrate. A result is that the substrate receives good film deposition. The liners also protect selected portions of the deposition zone from any unwanted film deposition. Such a deposition zone may be housed in a larger cold-wall reactor that provides a lower pressure second environment, plus access ports for substrates when the substrates are mounted on a linearly movable carrier that transports substrates out of the deposition zone.

The liner assembly may include a first set of liners forming an outer gas flow tunnel-like enclosure of the deposition zone with first outer side walls adapted to minimize heat loss from regions receiving the CVD process gas, as well as an inner deposition liner within that outer enclosure defined by the first set of liners. The inner deposition liner has second liner side walls that partially enclose a hot reaction zone immediately surrounding a perimeter of the substrate, except for an opening at the top provided to receive the CVD process gas. For example, the liner assembly may line any of (1) regions surrounding openings of a CVD process showerhead of the deposition zone, (2) a region immediately surrounding a location of the substrate (i.e., the hot zone defined by the inner liner) where spent reactant gas flows radially outwardly through the gas flow tunnel, and (3) gas isolation regions separating a concentration of CVD process gas in the deposition zone above the substrate from regions outside of the deposition zone in the nature of gas curtains surrounding deposition zones.

Portions of the liner assembly of the first environment may be in thermal communication with a heat source of the second environment so as to be maintained at an elevated temperature higher than the substrate. The liner material may be made from any of quartz, a ceramic, and/or graphite, which retain heat. The liner material is also preferably resistant to selected cleaning processes, such as etchants, that remove deposited material. Additionally, the liner assembly or portions thereof may be selectively removable from the deposition zone for replacement.

The carrier is supported on spaced apart rollers such that the carrier slides in a linear path. In this manner, one liner assembly can be moved away from a fixed showerhead while another liner assembly is placed below the showerhead. Such a structure allows assembly line deposition of substrates, one after another.

In one embodiment, a substrate carrier may support a plurality of wafer substrates for simultaneous processing by a plurality of showerheads. The plurality of wafer substrates may be arranged in one or more groups, each having a showerhead and associated liners.

DETAILED DESCRIPTION

Figure 1:
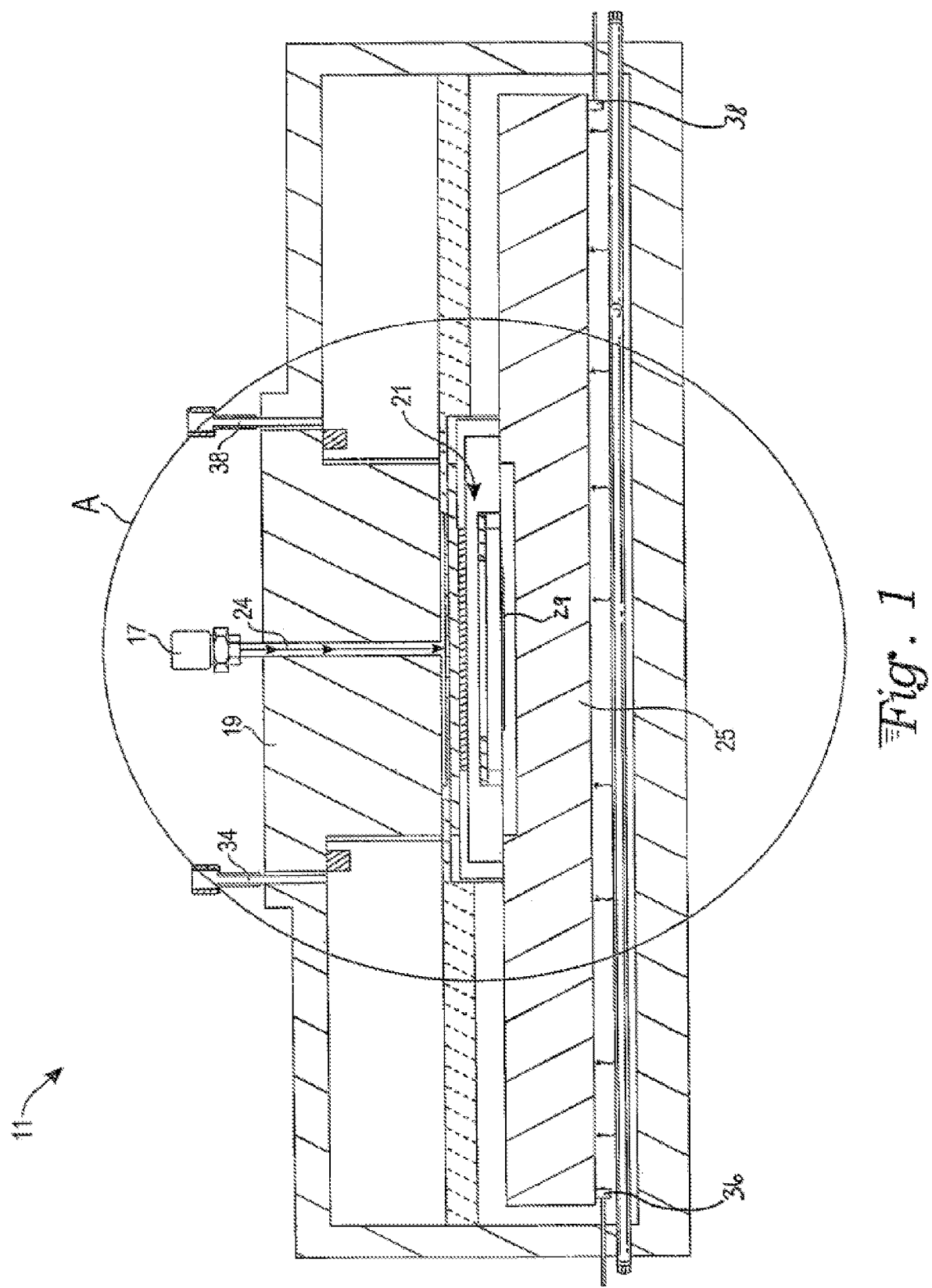
FIG. 1 is a cutaway side view of a CVD reactor in accord with the present invention.

With reference to FIG. 1, a CVD cold-wall reactor 11 is provided with a deposition zone 21 that is constructed so as to enclose an environment supporting thin film deposition onto a substrate. In particular, one or more process gas inlets 17 are provided for supplying gaseous CVD precursors via a showerhead assembly 19 toward a substrate 29 within the reactor 11, while one or more exhaust outlets is provided for removing any excess process gas and reaction products from the chamber 21. A movable carrier 25 receives and transports a substrate to be processed into the deposition zone 21, where it can be subject to any known CVD process. In FIG. 1, the carrier 25 moves out of the plane of the drawing on opposed rollers 36, 38. The deposition zone 21 may be considered as a central reactor within the larger cold-wall reactor 11 that provides the low pressure or vacuum environment for the deposition zone 21, substrate access ports, heating and cooling sources, radio frequency energy and substrate rotation if needed. Such cold-wall reactors are commercially known. A typical film to be deposited is a gallium arsenide film. Precursor gases are typically trimethyl gallium and arsine.

Figure 2:
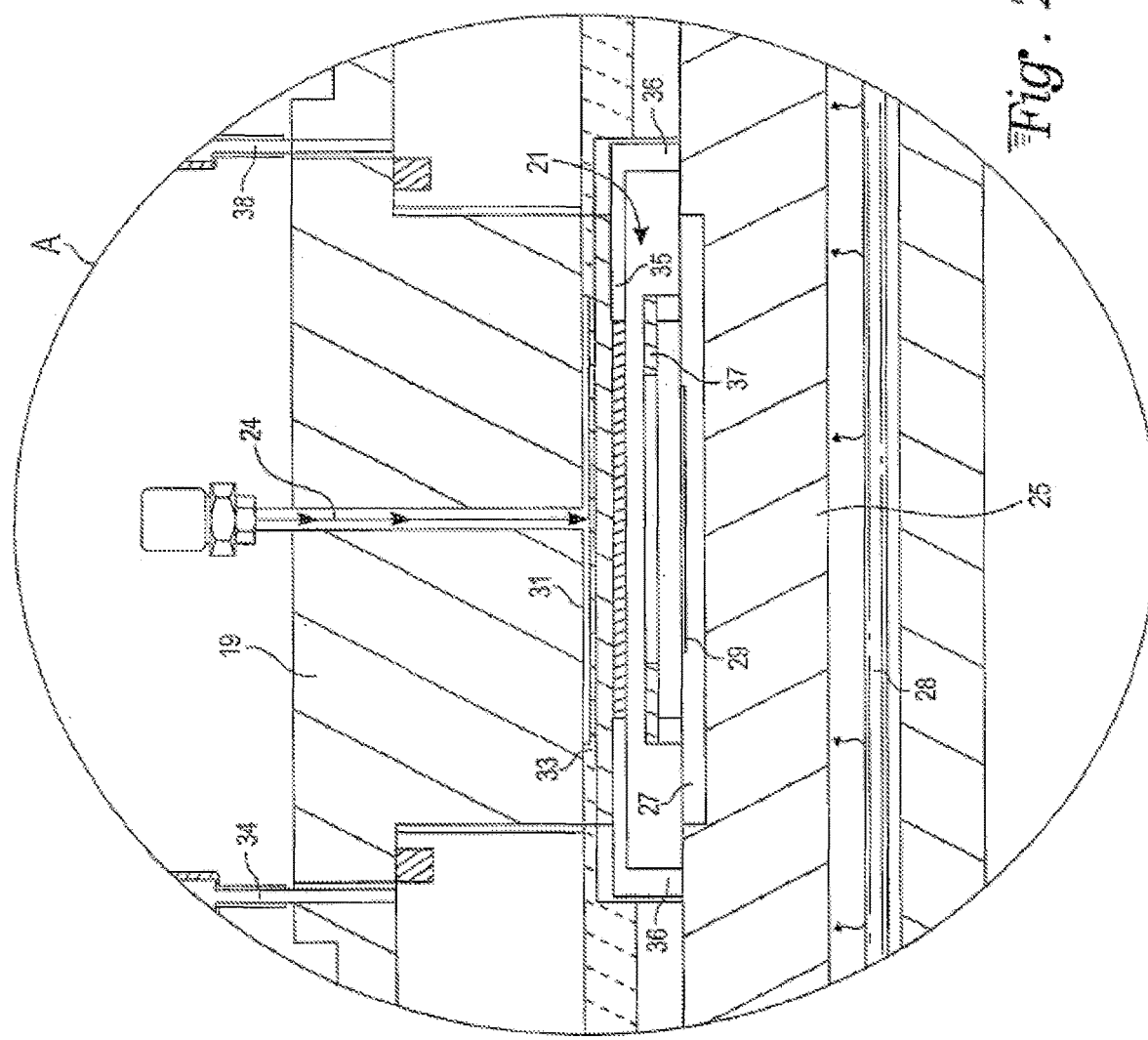
FIG. 2 is an enlarged view of a deposition zone of the reactor of FIG. 1, indicated by circle A, showing the presence of liners in accord with the present invention.

As seen in the enlarged view of the deposition zone 21 in FIG. 2, the carrier track 25 holds an oversized wafer susceptor 27 supporting a wafer substrate 29 thereon. The carrier 25 may be transparent material, such as fused silica or quartz, and the susceptor 27 may be preferably constructed from graphite material to form a thermal susceptor that is radiantly heatable by a set of lamps 28 located beneath the transparent carrier 25. The wafer substrate 29 may be heated by thermal conduction from the heated susceptor 27 on which it sits. The wafer carrier 27 and wafer substrate 29 are received by the carrier 25 into the deposition zone 21, e.g. through a port in the reactor 11, and likewise exits the deposition zone 21 through the same or a different port. The reactor 11 may include multiple processing and/or inspection chambers connected to each other through such ports, with the carrier 25 facilitating transport of a substrate on a wafer carrier between such chambers.

Within a portion of the chamber 21, a CVD hot zone is created as a first environment where CVD precursor gases 24 supplied to the chamber 21 by the showerhead assembly 19 through a plurality of apertures, not shown, react to form CVD reaction products that are formed on a substrate 29 present in the hot zone. In accord with the present invention, a box-like liner assembly comprising a plurality of stacked liners 33, 35, and 37 are provided so as to enclose the hot zone and thereby maintain a uniform temperature above the substrate 29. Liner 35 has legs 36 that support the liner from carrier 25. That is, the liner assembly forms at least one box around the substrate 29, creating the hot zone with small openings for radially outward gas flow. A first set of liners 33 and 35 may be arranged to form an outer box enclosure of that portion of the chamber 21 receiving the CVD precursor gases, with chamber lid liner 35 forming first outer side walls of that outer box enclosure, while the deposition liner 37 may form an inner enclosure, with second inner side walls of the deposition liner 37 immediately surrounding portions of the periphery of the substrate 29. The liner material may be any of quartz, a ceramic, and graphite, which retain heat. The liners 33, 35 and 37 receive their heat generally by convection from the flowing CVD gases and reaction products, but mostly from energy supplied by radiation from the hot carrier 27 and substrate 29.

The substrate 29 may itself be heated by conduction from the susceptor 27, which in turn may be heated by lamps, electrical induction, fluid passages, or any other convenient means in the cold-wall reactor, i.e., the second environment. The CVD precursor gases are preferably delivered to the hot zone already preheated to an elevated temperature (e.g., about 350° C.) just below a reaction temperature, and is then heated to its final reaction temperature (e.g., about 400 to 450° C.) for deposition by heat transfer onto the substrate 29 where CVD reactions occur. The surrounding inner liner material 37 maintains the heat in hot zone immediately above the substrate 29, like the walls of an oven, for creating conditions conducive to uniform deposition by reactions on the substrate 29. By maintaining the deposition zone at 400° C. or hotter, excess arsenic remains in a gaseous phase so that it can be pumped out through an exhaust port. Excess gallium tends to plate out onto the liners. At lateral edges of the showerhead, gas exhaust ports 34 and 38 may be provided to form part of a gas flow curtain around the showerhead. Such a gas flow curtain partly isolates the reaction chamber helping to form a reactor within a reactor, as explained further below.

Additionally, the liners 33, 35 and 37 of the liner assembly are positioned to line selected portions of the deposition zone 21 so as to control byproducts of the CVD reaction during deposition and protect those selected portions of the chamber 21 from unwanted film deposition. Management of deposition byproducts and temperature control are the principal functions of the liner assembly. Thus, a showerhead liner 33 protects a first zone of the deposition zone 21 surrounding the CVD process gas outlets 31 of the showerhead assembly 19. The showerhead. liner 33 minimizes loss of heat from the showerhead assembly 19 to prevent condensation of preheated CVD precursor gases in the showerhead channels and especially at its gas outlets 31. A chamber lid liner 35 protects a third zone of the deposition zone 21 outside of the deposition zone. It physically separates a concentration of the CVD process gas and reaction products in a hot deposition zone above the wafer substrate 29 from cooler isolation regions outside of the deposition zone. Additionally, pressure differences between the deposition zone and isolation regions may produce radially outward gas flows that direct any unreacted process gas and undeposited reaction products to an exhaust port of the chamber 21, such as an exhaust port 34 or 38. Finally, a deposition liner 37, in addition to forming an inner hot zone of the deposition zone 21, protects portions of the oversized wafer carrier 27 around the wafer substrate 29.

At least some portions of the liner assembly may be in thermal communication with one or more heat sources (radiant, convective, or conductive) so as to be maintained at an elevated temperature different from than the substrate so as to discourage deposition anywhere other than onto the wafer substrate 29. Even so, some deposition and/or condensation may occur onto the liners 33, 35 and 37. Accordingly, the preferred liner materials (e.g., quartz, a ceramic, or graphite), in addition to retaining heat, are preferably selected so as to be resistant to various cleaning processes.

The liners are preferably removable from the reaction chamber for maintenance or replacement. The deposition liner 37 nearest to the wafer substrate 29 is especially designed to be removable along with the substrate 29 and its susceptor 27 after each substrate processed. The reaction chamber with its gas curtain isolation provides a reduction in contaminants that is at least an order of magnitude less than in the surrounding reactor environment.

Figure 3:
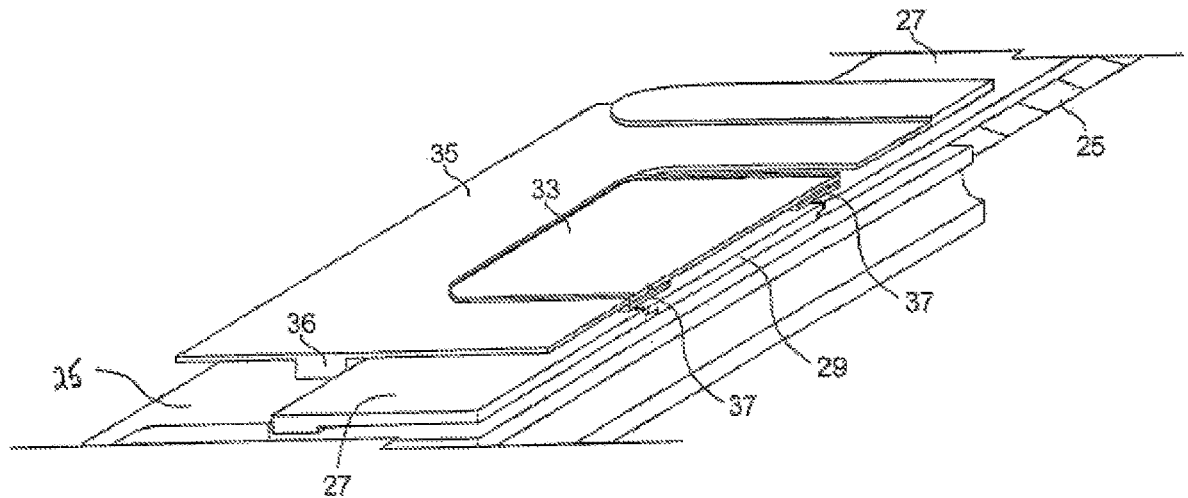
FIGS. 3 and 4 are cutaway perspective views of a deposition zone of the reactor of FIG. 1, respectively from above and below a substrate to be treated, and showing the various liners of the liner assembly.
Figure 4:
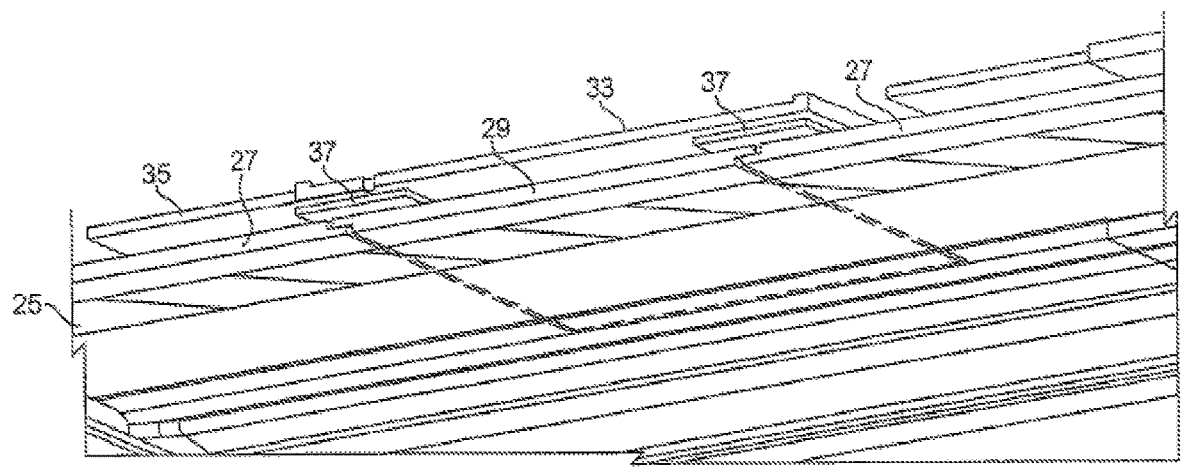

With reference to FIGS. 3 and 4, cutaway perspective views with the showerhead assembly 19 removed reveal the showerhead liner 33 surrounded by one or more plates of a chamber lid liner 35 overlying a susceptor 27 and carrier 25 carrying a wafer substrate 29. The showerhead liner 33, which generally corresponds in its location, shape and size with that of the showerhead assembly's process gas inlet, overlays the processing location of a wafer substrate 29 inserted into the reactor. The chamber lid liner 35 surrounds the showerhead liner 33. In the depicted embodiment, the chamber lid liner 35 is seen to have legs 36 extending downward along the sides of the susceptor 27 onto the carrier 25. Alternatively, the legs 36 could be replaced by side panels. In either case, the legs 36 or side panels form a tunnel or cap with the chamber lid liner 35 around the deposition zone that both confines process reaction gas and minimizes heat loss in the lateral direction, yet allows excess or spent gas to flow out. A deposition liner 37 seated on the susceptor 27 and the movable carrier surrounds a perimeter of the wafer substrate 29 so as to form a kind of partial inner "box" or "dome", with the fixed showerhead liner 33 forming the box or dome's cover and the deposition liner 37 defining its side walls on all sides of the wafer substrate 29. The deposition liner therefore ensures temperature and process gas uniformity over the wafer substrate surface.

Figure 5:
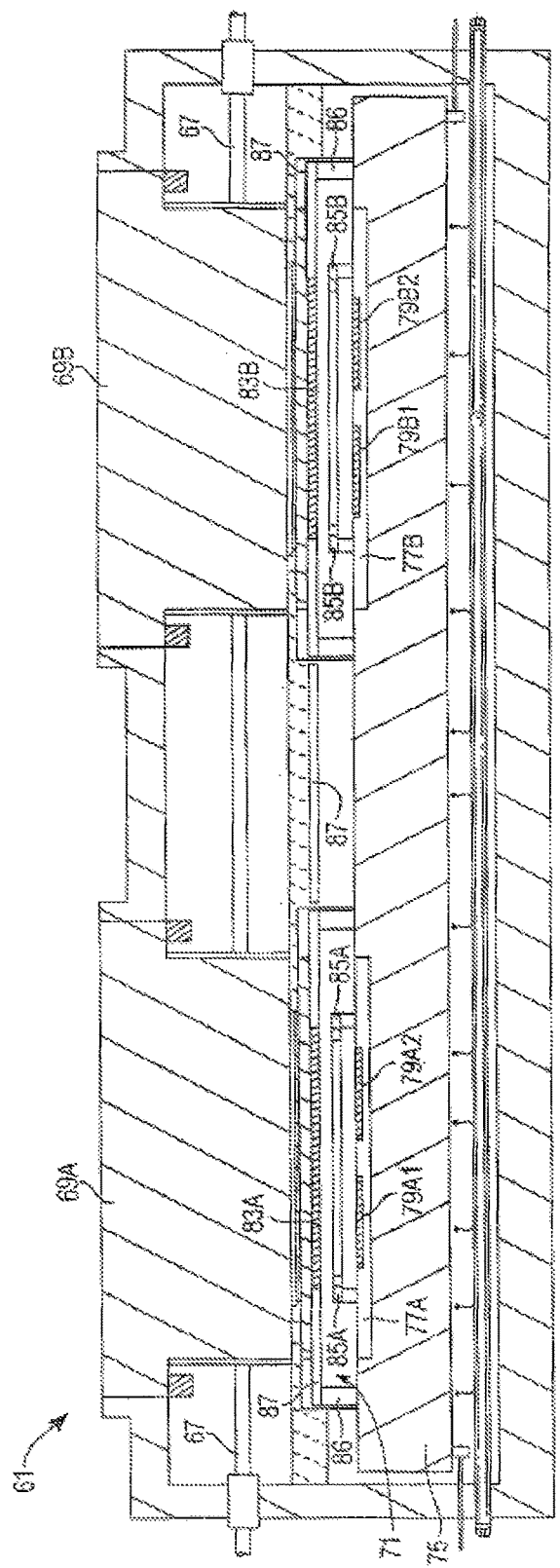
FIG. 5 is a cutaway side view of an alternative CVD reactor with multiple deposition zones accommodating the processing of multiple semiconductor substrates or wafer substrates at one time.
Figure 6:
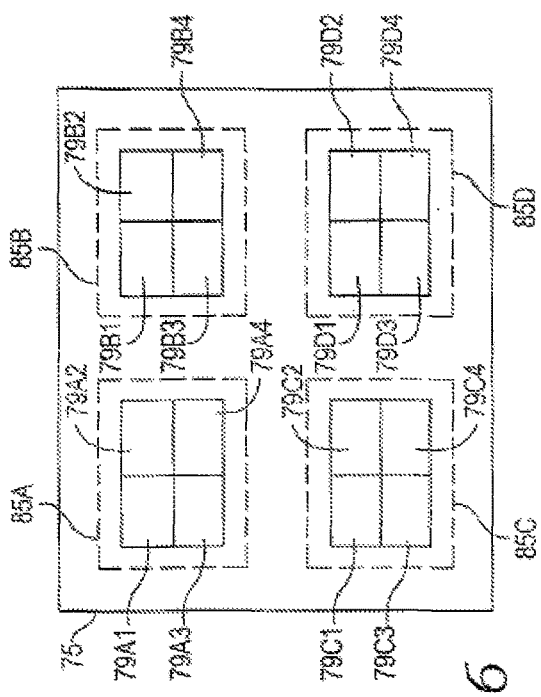
FIG. 6 is a top view of a substrate carrier with multiple substrates for processing in the reactor of FIG. 5.

With reference to FIGS. 5 and 6, another CVD reactor embodiment 61 illustrates the possibility of scaling to accommodate the processing of multiple wafer substrates 79A1-79D4 at one time, while still maintaining the use of liners for promoting deposition uniformity. The illustrated embodiment provides for 16 wafer substrates, shown here as grouped into four sets of four, 79A1-79A4, 79B1-79B4, 79C1-79C4 and 79D1-79D4. Different numbers of wafers and different groupings are possible in a variety of reactor embodiments. Each set of wafers has an associated showerhead, of which showerheads 69A and 69B are seen in FIG. 5. The showerheads are connected to one or more supplies of process gases, represented by conduits 67. Each of the showerheads has a showerhead liner, e.g., 83A and 83B, and the showerhead liners are in turn surrounded by one or more plates forming a chamber lid liner 87 with side panels or legs 86 at lateral sides of each deposition zone associated with a group of wafers, such that the combination of showerhead liners and chamber lid liners forms a tunnel or cap around the respective deposition zones that both confine process gas and minimizes heat loss in the later direction. Additionally, each group of wafer substrates 79A1-79A4, 79B1-79B4, 79C1-79C4, and 79D1-79D4, has a corresponding deposition liner 85A-85D positioned on the movable wafer carriers 77A-77D surrounding the parameter of each group. In combination with the showerhead liners, the deposition liners form a kind of partial inner box or dome around the wafer substrates that ensure temperature and process gas uniformity over each wafer substrate surface and isolate one environment from another. The movable carriers allow liner assemblies to be moved away from fixed showerheads for cleaning.

The reactor structure provided by the present invention allows better uniformity of deposition by creating an environment where the substrate has uniform temperature over its entire surface and where the CVD process gases over the substrate are likewise at a uniform temperature in a hot zone. The regions or zones enclosed by the various sets of liners facilitate heat retention for such temperature uniformity, while the liners themselves also serve to protect selected portions of the chamber from unwanted deposition and to facilitate short downtimes for cleaning and maintenance.

What is claimed is:

1. A method for chemical vapor deposition (CVD) of thin films, comprising:
   providing a deposition zone in a reaction chamber, the reaction chamber having a fixed showerhead assembly that introduces CVD reactive gases under positive pressure into the deposition zone;
   moving a substrate carrier beneath the showerhead assembly in the reaction chamber, the substrate carrier being constructed to support and transport at least one substrate within the reaction chamber so as to be subjected to a CVD process by the CVD reactive gases;
   providing a liner assembly shrouding the deposition zone and including at least one partial enclosure around the deposition zone isolating the deposition zone and the substrate carrier, whereby solid reaction byproducts are plated onto material in the liner assembly and gaseous reaction byproducts flow radially outward, the liner assembly being mounted on the substrate carrier for motion with the substrate carrier, and wherein the at least one partial enclosure of the liner assembly includes:
      a chamber lid liner and a showerhead liner in a shape of an outer tunnel enclosure of the deposition zone, wherein the chamber lid liner includes a plate and a pair of legs that are directly disposed on the substrate carrier at lateral sides of the plate, and
      a deposition liner within and beneath the outer tunnel enclosure formed by the chamber lid liner and the showerhead liner;
   maintaining a deposition zone temperature in the deposition zone during the CVD process;
   depositing a thin film onto a surface of the at least one substrate as part of the CVD process;
   exhausting the radially outwardly flowing gaseous reaction byproducts at a periphery of the reaction chamber; and
   moving the substrate carrier with the at least one substrate out of the deposition zone.

2. The method of claim 1, wherein the plate extending from the legs along a length perpendicular to the legs and parallel to a length of the substrate carrier, the showerhead liner surrounded by the plate and overlaying a substrate processing location, and the outer tunnel enclosure adapted to minimize heat loss from regions receiving the CVD reactive gases.

3. The method of claim 1, wherein the deposition liner is separate from the chamber lid liner and the showerhead liner, walls of the deposition liner being directly positioned on a susceptor held by the substrate carrier and surrounding all sides of the at least one substrate, thereby protecting portions of the substrate carrier around the at least one substrate, the outer tunnel enclosure allowing gas to flow radially outwardly.

4. The method of claim 1, further comprising providing a radiant and convective energy within the reaction chamber for maintaining the deposition zone temperature.

5. The method of claim 4, wherein:
the substrate carrier is transmissive of the radiant and convective energy, and
the radiant and convective energy is provided by a lamp source to the at least one substrate through the substrate carrier.

6. The method of claim 1, further comprising introducing the CVD reactive gases by the fixed showerhead assembly into the deposition zone at a first temperature and heating the CVD reactive gases to a second temperature at the deposition zone, the second temperature being higher than the first temperature.

7. The method of claim 6, wherein the first temperature is 350° C. and the second temperature is between 400° C. and 450° C.

8. The method of claim 1, wherein maintaining the deposition zone temperature in the deposition zone includes maintaining the deposition zone temperature at 400° C. or a higher temperature.

9. The method of claim 1, further comprising removing the deposition liner along with the at least one substrate and a susceptor held by the substrate carrier after the depositing of the thin film onto the surface of the at least one substrate.

10. The method of claim 1, wherein material for at least a portion of the liner assembly is one of quartz, a ceramic, or graphite.

11. The method of claim 1, further comprising providing gas curtain regions surrounding outlets of the showerhead assembly.

12. The method of claim 1, wherein moving the substrate carrier beneath the showerhead assembly includes moving the substrate carrier in a linear motion over a rollers in the reaction chamber.

13. The method of claim 1, wherein moving the substrate carrier out of the deposition zone includes moving the substrate carrier in a linear motion over a rollers in the reaction chamber.

14. The method of claim 1, wherein:
moving the substrate carrier beneath the showerhead assembly includes moving the substrate carrier into the reaction chamber through a port, and
moving the substrate carrier out of the deposition zone includes moving the substrate carrier out of the reaction chamber through the port or through a different port.

* * * * *